(12) United States Patent
Tseng et al.

(10) Patent No.: US 7,167,362 B2
(45) Date of Patent: Jan. 23, 2007

(54) MULTIBAY WITH UNPLUGGING/POSITIONING MECHANISM

(75) Inventors: Scott Tseng, Taipei (TW); Sung-Ming Song, Taipei (TW)

(73) Assignee: Inventec Corporation, Taipei (TW)

( * ) Notice: Subject to any disclaimer, the term of this patent is extended or adjusted under 35 U.S.C. 154(b) by 260 days.

(21) Appl. No.: 11/017,841

(22) Filed: Dec. 22, 2004

(65) Prior Publication Data

US 2006/0133028 A1 Jun. 22, 2006

(51) Int. Cl.
*G06F 1/16* (2006.01)

(52) U.S. Cl. ..................... 361/686; 361/685

(58) Field of Classification Search ............. 361/685, 361/686
See application file for complete search history.

(56) References Cited

U.S. PATENT DOCUMENTS 5,305,180 A * 4/1994 Mitchell et al. ............ 361/685
5,740,012 A * 4/1998 Choi ......................... 361/686
5,825,616 A * 10/1998 Howell et al. .............. 361/684

* cited by examiner

*Primary Examiner*—Yean-Hsi Chang
(74) *Attorney, Agent, or Firm*—Bacon & Thomas, PLLC

(57) ABSTRACT

The present invention is to provide a MultiBay with unplugging/positioning mechanism, in which the mechanism is installed over one side of a bay and equipped with an movable rod and a latch so that when a peripheral device is inserted in an insertion hole installed at one end of the bay, a brake column installed at bottom side of the peripheral device pushes against the movable rod. After the movable rod is pushed to a fixed distance, the bounced force will make the latch stick out to exactly insert in a positioning hole installed on the peripheral device, making the peripheral device be positioned at the location where another connector on top of the peripheral device and one connector installed inside another end of the bay are connected.

5 Claims, 3 Drawing Sheets

MULTIBAY WITH UNPLUGGING/POSITIONING MECHANISM

FIELD OF THE INVENTION

The present invention relates to a MULTIBAY, more particularly to a MultiBay with a unplugging/positioning mechanism, enabling a user to remove or insert a peripheral device (e.g. swappable second hard disk for expansion, disc burner, DVD-ROM or floppy disk drive, etc.) from or into a notebook computer through operating the unplugging/positioning mechanism without damaging the related circuit or contact due to improper force exertion or deviation.

BACKGROUND OF THE INVENTION

A MultiBay in the market is designed to facilitate user's addition of other peripheral device (e.g. swappable second hard disk for expansion, disc burner, DVD-ROM or floppy disk drive, etc.) so as to expand the options of a notebook computer similar to those of a desktop PC, effectively enhancing the functionality of the notebook computer and the operational convenience.

However, for the peripheral device installed in the conventional MultiBay, usually, it needs to exert force on another connector on the MultiBay in a state that the connector originally connected with the MultiBay is unplugged and pulled off when user intends to unplug the peripheral for replacement for whatever reason (say, upgrade or outdoor carry, etc.). As a result, this not only violates the design of ergonomics, but also easily results in the damage to the connector of the MultiBay, another connector of the peripheral and the related circuit or contact damage due to improper force exertion or deviation when user is unplugging, causing tremendous loss of user. According, how to design a resolution capable of improving the said drawback is actually the subject that the industry must tackle.

SUMMARY OF THE INVENTION

In view of the detailed introduction of the said prior art, it's not so hard for us to realize that there's no any design available in conventional MultiBay dedicated for the unplugging and positioning mechanism in order to prevent the peripheral device installed in the MultiBay from resulting in tremendous damage to the related circuit or contact due to improper force exertion or deviation when user is unplugging or pulling off the peripheral. Therefore, for sake of the practical need of market and user and resolution to tackle the said issue, engaged in the profession for years, the inventor finally develops a [MultiBay with unplug and position mechanism] of the invention after livelong endeavor in research and experiment, hoping to contribute to the society with the ingenious conception of the invention.

One objective of the invention targets at providing a MultiBay with unplugging/positioning mechanism, in which the unplugging/positioning mechanism is installed over one side of a bay and equipped with an movable rod and a latch so that when a peripheral device (e.g. swappable second hard disk for expansion, disc burner, DVD-ROM or floppy disk drive, etc.) is inserted in an insertion hole installed at one end of the bay, a brake column installed at bottom side of the peripheral device pushes against the movable rod. After the movable rod is pushed to a fixed distance, the bounced force will make the latch inside the unplugging/positioning mechanism stick out to exactly insert in a positioning hole installed on the corresponding position of the peripheral device, making the peripheral device be positioned at the location where another connector on top of the peripheral device and one connector installed inside another end of the bay are connected.

Another objective of the invention targets at providing a MultiBay with unplugging/positioning mechanism that just needs to push the peripheral device when user intends to unplug the peripheral device from the bay, making the brake column further push against the movable rod and bring the latch back inside the unplugging/positioning mechanism. Meanwhile, as the peripheral device has no positioning function of the latch, the bounced force of the movable rod can unplug the peripheral device from the insertion hole of the bay, and at the same time smoothly and evenly separate another connector on the peripheral device from the connected position of the connector on the bay. As such, the simple means in compliance with ergonomics most can be used to improve the regretful occurrence of tremendous loss to user resulting from the damage to the related circuit or contact due to improper force exertion or deviation.

One more objective of the invention targets at providing a MultiBay with unplugging/positioning mechanism, whose bottom can be hinged with a rotary support base. Normally, the support base is folded in the bottom of the MultiBay body. When intending to get the MultiBay body upstanding, the support base can be oriented to expose two bottom sides of the MultiBay body so as to expand the support area of the MultiBay body bottom for attaining stable upstanding effect.

The above and other objects, features and advantages of the present invention will become apparent from the following detailed description taken with the accompanying drawings.

DETAILED DESCRIPTION OF THE PREFERRED EMBODIMENTS

Figure 1:
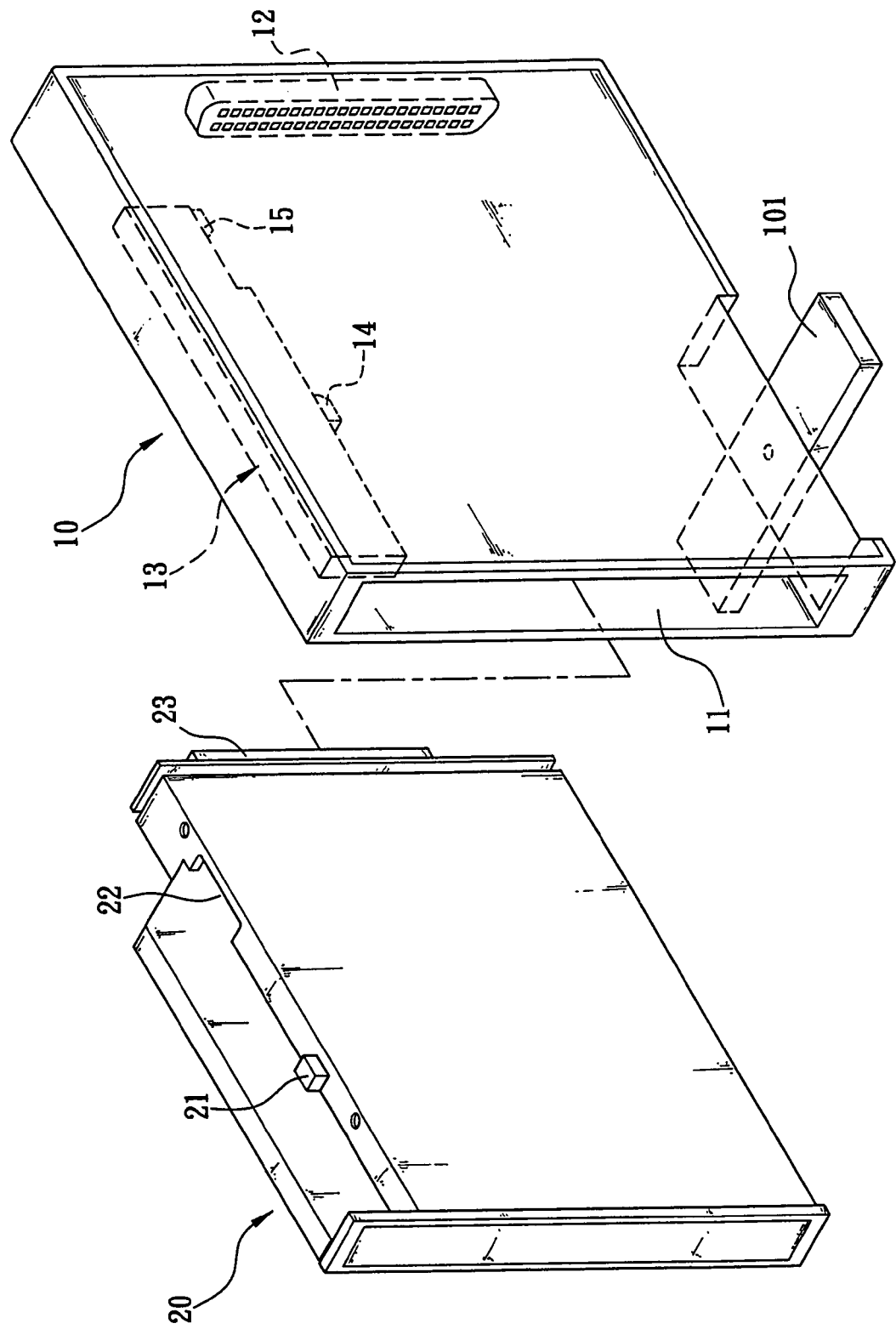
FIG. 1 is the outward form illustrative view of the MultiBay and peripheral device.

The invention is a MultiBay with unplugging/positioning mechanism. Please refer to FIG. 1 illustrating to install a MultiBay body 10 whose one end is installed an insertion hole 11 and another end is built in with a connector 12 used to connect the related circuit or contact. One side inside the MultiBay body 10 in the proximity of the insertion hole 11 is installed with a unplugging/positioning mechanism 13, whose one side is installed with a movable rod 14 and a latch 15, such that the movable rod 14 is pushed by external force to a fixed distance, the bounced force makes the latch 15 of the unplugging/positioning mechanism stick out, and after the movable rod 14 is pushed by external force again, the latch 15 is drawn back inside the unplugging/positioning mechanism 13 to further recover to its original state.

In the invention, please refer to FIG. 1, which illustrates that the insertion hole 11 on one side of the MultiBay 10 can be inserted by a peripheral device 20 (in embodiment, the peripheral device 20 can be a swappable second hard disk for expansion, disc burner, DVD-ROM or floppy disk drive, etc.). The places where corresponds to the movable rod 14 and latch 15 on bottom of the peripheral device 20 are installed with a brake column 21 and a positioning hole 22, and the place where one end of the peripheral device 20 corresponds to the connector 12 in another end of the MultiBay body 10 is installed with another connector 23 capable of achieving the goal of mutually connecting with the connector 12.

Besides, please refer to FIG. 1 again, which illustrates that the bottom of the MultiBay body is hinged a rotary support base 101, which is usually folded in the bottom of the MultiBay body 10. When intending to get the MultiBay body 10 upstanding, the support base can be oriented to expose two bottom sides of the MultiBay body so as to expand the support area of the MultiBay body bottom for attaining stable upstanding effect.

By means of the said parts, it's not difficult to understand. Please refer to FIG. 2, which illustrates that the brake column 21 installed on the bottom of the peripheral device 20 will push against the movable rod 14 when the peripheral device 20 is inserted in the insertion hole 11 of the MultiBay body 10. When the movable rod 14 is pushed to a fixed distance, the bounced force will make the latch 15 inside the unplugging/positioning mechanism 13 stick out to exactly insert in the insertion hole 22 installed at the corresponding position of the peripheral device 20. Please refer to FIG. 3, which illustrate to position the peripheral device 20 exactly at the connected position of another connector 23 on the peripheral device 20 and the connector inside the MultiBay body 10. Thus, the mutual connection and subsequent operation application can be achieved.

Figure 2:
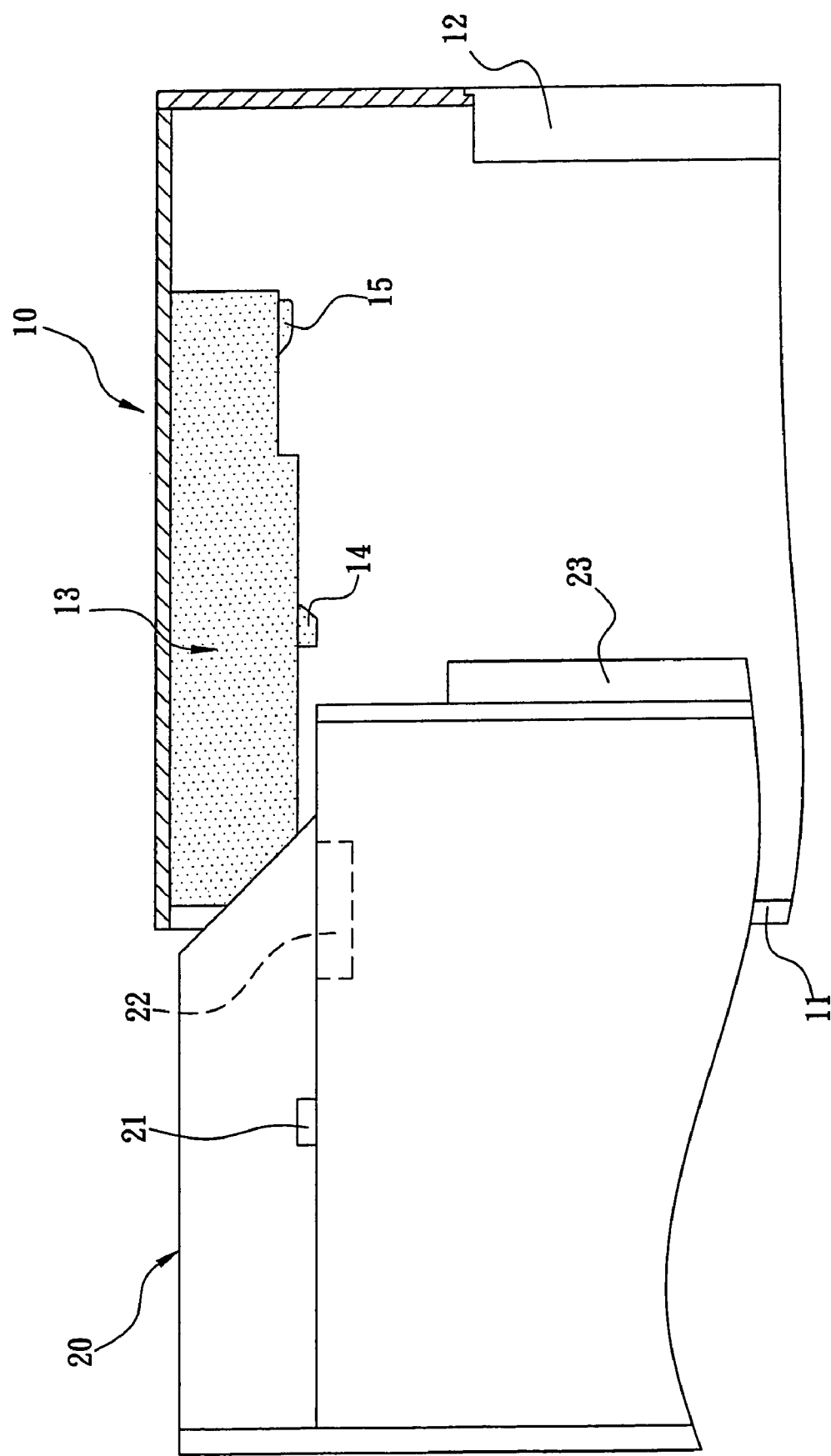
FIG. 2 is the movement illustrative view I of the unplugging/positioning mechanism and peripheral device of the invention.
Figure 3:
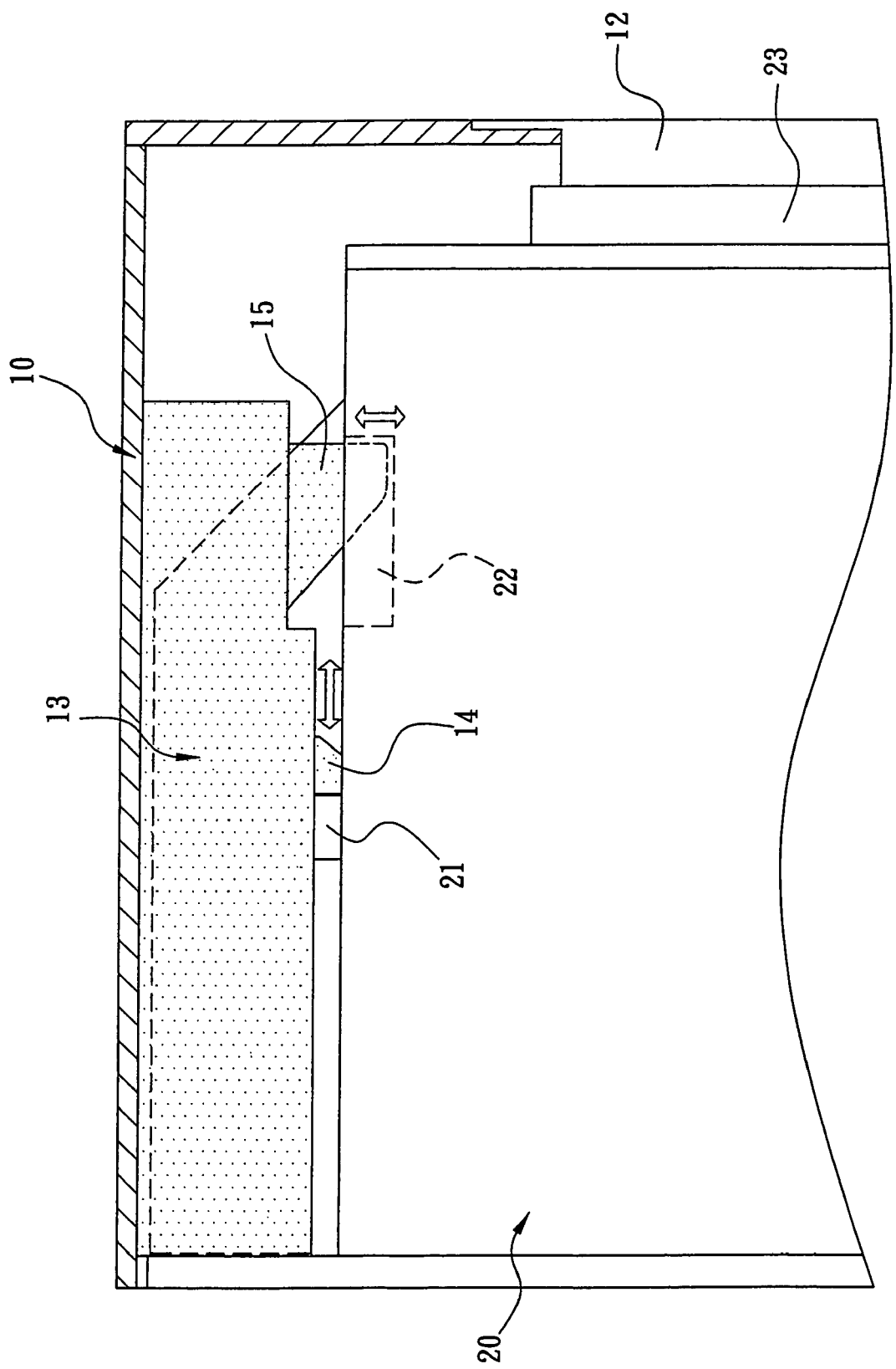
FIG. 3 is the movement illustrative view II of the unplugging/positioning mechanism and peripheral device of the invention.

Otherwise, when user intends to unplug the peripheral device 20 from the MultiBay body 10, just need to push the peripheral device 20 to make the brake column on top of it push the movable rod 14 again so as to bring the latch 15 back inside the unplugging/positioning mechanism 13. When unplugging the peripheral 20, the bounced force of the movable rod 14 unplugs the peripheral device 20 from the insertion hole 11 of the MultiBay body 10 (as shown in FIG. 2) as the peripheral device 20 has no positioning function of the latch 15. Meanwhile, smoothly and evenly separate another connector 23 of the peripheral device 20 from the connected position of the connector 10 on the MultiBay body 10.

According to the foregoing description, the unplugging/positioning mechanism 13 of the invention can be installed on or unplugged from the MultiBay body 10 and secure the connector 12 on the MultiBay body 10 and another connector 23 on the peripheral 20 to prevent from incurring damage due to improper force exertion when inserting or unplugging using the simple means in compliance with ergonomics most when user installs or unplug the peripheral device 20. As such, the regretful occurrence that traditionally costs user the tremendous loss caused by damage to the related circuit or contact due to improper force exertion or deviation can be improved.

Furthermore, by means of the support base 101 (as shown in FIG. 1) over bottom of the MultiBay body 10, the MultiBay body 10, when standing up, can be oriented to expose the two bottom sides of the MultiBay body 10 so as to expand its support area and further attain the effect of stabilizing the upstanding effect.

While the invention has been described by means of specific embodiments, numerous modifications and variations could be made thereto by those skilled in the art without departing from the scope and spirit of the invention set forth in the claims.

What is claimed is:

1. A MultiBay with unplugging/positioning mechanism comprises:

a MultiBay body whose one end is installed with an insertion hole and another end is built in a connector used to connect a related circuit or contact;

an unplugging/positioning mechanism installed over one side inside the MultiBay body having a movable rod and a latch on its one side so that a bounced force makes the latch stick out after the movable rod is pushed by external force to a fixed distance and brings the latch back inside the unplugging/positioning mechanism after the movable rod is pushed by external force once again;

a peripheral device, which can be inserted in the insertion hole over one end of the MultiBay body, is installed with a brake column and a positioning hole respectively at places corresponding to the movable rod and latch of the unplugging/positioning mechanism, and is installed with another connector over one end of the peripheral device corresponding to the connector inside another end of the MultiBay body capable of being mutually connected with the connector.

2. The MultiBay with unplugging/positioning mechanism of claim 1, wherein a bottom of the said MultiBay body is hinged a rotary support base capable of being oriented to where two bottom sides of the MultiBay won't cover.

3. The MultiBay with unplugging/positioning mechanism of claim 1, wherein the unplugging/positioning mechanism is installed at one side inside the MultiBay body in a proximity of the insertion hole.

4. The MultiBay with unplugging/positioning mechanism of claim 1, wherein the brake column and the positioning hole are installed on a bottom of the peripheral device.

5. The MultiBay with unplugging/positioning mechanism of claim 1, wherein the peripheral device may be a swappable second hard disk for expansion, disc burner, DVD-ROM or floppy disk drive.

* * * * *